(12) United States Patent
Zhao

(10) Patent No.: US 10,916,171 B2
(45) Date of Patent: *Feb. 9, 2021

(54) GATE DRIVER ON ARRAY CIRCUIT AND DISPLAY PANEL

(71) Applicant: Wuhan China Star Optoelectronics Technology Co., Ltd., Wuhan (CN)

(72) Inventor: Mang Zhao, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/611,225

(22) PCT Filed: Aug. 15, 2019

(86) PCT No.: PCT/CN2019/100875
§ 371 (c)(1),
(2) Date: Nov. 6, 2019

(87) PCT Pub. No.: WO2020/107949
PCT Pub. Date: Jun. 4, 2020

(65) Prior Publication Data
US 2020/0258437 A1 Aug. 13, 2020

(30) Foreign Application Priority Data
Nov. 28, 2018 (CN) .......................... 2018 1 1437407

(51) Int. Cl.
*G09G 3/20* (2006.01)

(52) U.S. Cl.
CPC ....... *G09G 3/20* (2013.01); *G09G 2300/0408* (2013.01); *G09G 2300/08* (2013.01); *G09G 2310/0267* (2013.01); *G09G 2310/0283* (2013.01); *G09G 2310/08* (2013.01)

(58) Field of Classification Search
None
See application file for complete search history.

(56) References Cited

U.S. PATENT DOCUMENTS

2016/0224175 A1* 8/2016 Moon ................. G06F 3/0412
2019/0096500 A1* 3/2019 Gu .......................... G09G 3/20

* cited by examiner

*Primary Examiner* — Matthew Yeung

(57) ABSTRACT

A GOA circuit and a display panel. By using a first control clock and a third control clock in a forward and reverse scanning module to control a first node, the GOA circuit is able to avoid leakage of the first node during operation and improve the reliability of GOA circuit.

20 Claims, 4 Drawing Sheets

GATE DRIVER ON ARRAY CIRCUIT AND DISPLAY PANEL

RELATED APPLICATIONS

This application is a National Phase of PCT Patent Application No. PCT/CN2019/100875 having International filing date of Aug. 15, 2019, which claims the benefit of priority of Chinese Patent Application No. 201811437407.5 filed on Nov. 28, 2018. The contents of the above applications are all incorporated by reference as if fully set forth herein in their entirety.

FIELD AND BACKGROUND OF THE INVENTION

The present invention relates to the field of display technologies, and in particular, to a gate driver on array (GOA) circuit and display panel.

GOA circuits integrate a gate driving circuit on an array substrate of a display panel, so that a gate driving integrated circuit can be omitted to reduce product costs.

Current GOA circuits have a risk of leakage and have poor reliability.

SUMMARY OF THE INVENTION

The present application provides a gate driver on array (GOA) circuit, wherein comprising a multi-level cascaded GOA unit, each level of the GOA unit comprises a forward and reverse scanning module, an output module, and a pull-down module;

wherein the forward and reverse scanning module is connected to a previous-stage scanning driving signal, a forward scanning signal, a next-stage scanning driving signal, a reverse scanning signal, and a constant low-level signal, and is electrically connected to a first control clock, a third control clock, a first node, and a second node, the forward and reverse scanning module is used for outputting the forward scanning signal to the first node, or for outputting the reverse scanning signal to the first node, and outputting the constant low-level signal to the second node a voltage potential control of the first node;

wherein the output module is connected to the constant low-level signal and a constant high-level signal, and is electrically connected to the first node and the second control clock for outputting a scan driving signal of the current stage;

wherein the pull-down module is connected to the constant low-level signal, the forward scanning signal, the reverse scanning signal, and the constant high-level signal, and is electrically connected to the first control clock, the third control clock, the first node, and the scan driving signal of the current stage, the pull-down module is used for pulling down a voltage potential of the first node and a voltage potential of the scan driving signal of the current stage to the constant low-level signal;

wherein the forward and reverse scanning module comprises a first transistor, a second transistor, a third transistor, a fourth transistor, and a fifth transistor;

wherein a gate of the first transistor is electrically connected to the first control clock, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node;

wherein the output module comprises a sixth transistor, a seventh transistor, and a first capacitor;

wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock, a drain of the seventh transistor is electrically connected to the scanning driving signal of the current stage, an end of the first capacitor is electrically connected to the first node, the other end of the first capacitor is electrically connected to the constant low-level signal.

In the GOA circuit of the present application, the pull-down module comprises: an eighth transistor, a ninth transistor, a tenth transistor, an eleventh transistor, a twelfth transistor, and a second capacitor;

wherein a gate of the eighth transistor is connected to the forward scanning signal, a source of the eighth transistor is electrically connected to the third control clock, a gate of the ninth transistor is connected to the reverse scanning signal, a source of the ninth transistor is electrically connected to the first control clock, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

In the GOA circuit of the present application, the GOA circuit receives a first main clock signal, a second main clock signal, a third main clock signal, and a fourth main clock signal, the first main clock signal, the second main clock signal, the third main clock signal, and the fourth main clock signal are sequentially time-divided in active period of the GOA circuit;

wherein in a (1+8k)th GOA unit and a (2+8k)th GOA unit, the second control clock is connected to the first main clock signal, the third control clock is connected to the second main clock signal, and the first control clock is connected to the fourth main clock signal;

wherein in a (3+8k)th GOA unit and a (4+8k)th GOA unit, the second control clock is connected to the second main clock signal, the third control clock is connected to the third main clock signal, and the first control clock is connected to the first main clock signal;

wherein in a (5+8k)th GOA unit and a (6+8k)th GOA unit, the second control clock is connected to the third main clock signal, the third control clock is connected to the fourth main clock signal, and the first control clock is connected to the second main clock signal;

wherein in a (7+8k)th GOA unit and a (8+8k)th GOA unit, the second control clock is connected to the fourth main clock signal, the third control clock is connected to the first main clock signal, and the first control clock is connected to the third main clock signal; wherein k is a positive integer.

In the GOA circuit of the present application, the GOA circuit receives a first minor clock signal, a second minor clock signal, a third minor clock signal, a fourth minor clock signal, a fifth minor clock signal, a sixth minor clock signal, a seventh minor clock signal, and an eighth minor clock signal, the first minor clock signal, the second minor clock signal, the third minor clock signal, the fourth minor clock signal, the fifth minor clock signal, the sixth minor clock signal, the seventh minor clock signal and the eighth minor clock signal are sequentially time-divided in an active period of the GOA circuit;

wherein in a (1+8k)th GOA unit, the second control clock accesses the first minor clock signal, the third control clock accesses the third minor clock signal, and the first control clock accesses the seventh minor clock signal;

wherein in a (2+8k)th GOA unit, the second control clock accesses the second minor clock signal, the third control clock accesses the fourth minor clock signal, and the first control clock accesses the eighth minor clock signal;

wherein in a (3+8k)th GOA unit, the second control clock accesses the third minor clock signal, the third control clock accesses the fifth minor clock signal, and the first control clock accesses the first minor clock signal;

wherein in a (4+8k)th GOA unit, the second control clock accesses the fourth minor clock signal, the third control clock accesses the sixth minor clock signal, and the first control clock accesses the second minor clock signal;

wherein in a (5+8k)th GOA unit, the second control clock accesses the fifth minor clock signal, the third control clock accesses the seventh minor clock signal, and the first control clock accesses the third minor clock signal;

wherein in a (6+8k)th GOA unit, the second control clock accesses the sixth minor clock signal, the third control clock accesses the eighth minor clock signal, and the first control clock accesses the fourth minor clock signal wherein in a (7+8k)th GOA unit, the second control clock accesses the seventh minor clock signal, the third control clock accesses the first minor clock signal, and the first control clock accesses the fifth minor clock signal;

wherein in a (8+8k)th GOA unit, the second control clock accesses the eighth minor clock signal, the third control clock accesses the second minor clock signal, and the first control clock accesses the sixth minor clock signal;

wherein k is a positive integer.

In the GOA circuit of the present application, the GOA unit further comprises a function control module, the function control module accesses a first function control signal and a second function control signal, and is electrically connected to the first node, the second node, and the current level scan driving signal, the function control module is used for implementing opening functions and shutdown functions of all of scanning drive signals for the GOA circuit.

In the GOA circuit of the present application, the function control module comprises: a thirteenth transistor, a fourteenth transistor, a fifteenth transistor, and a sixteenth transistor;

wherein a gate of the thirteenth transistor, a gate of the fourteenth transistor, and a source and a gate of the fifteenth transistor are connected to the first function control signal, a gate of the sixteenth transistor is connected to the second function control signal, a source of the thirteenth transistor, a source of the fourteenth transistor, and a source of the sixteenth transistor are connected to the constant low-level signal, a drain of the thirteenth transistor is electrically connected to the first node, a drain of the fourteenth transistor is electrically connected to the second node, a drain of the fifteenth transistor and a drain of the sixteenth transistor are electrically connected to a scan driving signal of the current stage.

In the GOA circuit of the present application, the GOA circuit comprises an opening function phase and a shutdown function phase;

wherein in the opening function phase, the first function control signal is at a high level, and the second function control signal is at a low level;

wherein in the shutdown function phase, the first function control signal is at a low level, and the second function control signal is at a high level.

The present application further provides a GOA circuit, wherein comprising a multi-level cascaded GOA unit, each level of the GOA unit comprises a forward and reverse scanning module, an output module, and a pull-down module;

wherein the forward and reverse scanning module is connected to a previous-stage scanning driving signal, a forward scanning signal, a next-stage scanning driving signal, a reverse scanning signal, and a constant low-level signal, and is electrically connected to a first control clock, a third control clock, a first node, and a second node, the forward and reverse scanning module is used for outputting the forward scanning signal to the first node, or for outputting the reverse scanning signal to the first node, and outputting the constant low-level signal to the second node a voltage potential control of the first node;

wherein the output module is connected to the constant low-level signal and a constant high-level signal, and is electrically connected to the first node and the second control clock for outputting a scan driving signal of the current stage;

wherein the pull-down module is connected to the constant low-level signal, the forward scanning signal, the reverse scanning signal, and the constant high-level signal, and is electrically connected to the first control clock, the third control clock, the first node, and the scan driving signal of the current stage, the pull-down module is used for pulling down a voltage potential of the first node and a voltage potential of the scan driving signal of the current stage to the constant low-level signal.

In the GOA circuit of the present application, the forward and reverse scanning module comprises a first transistor, a second transistor, a third transistor, a fourth transistor, and a fifth transistor;

wherein a gate of the first transistor is electrically connected to the first control clock, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node.

In the GOA circuit of the present application, the output module comprises a sixth transistor, a seventh transistor, and a first capacitor;

wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock, a drain of the seventh transistor is electrically connected to the scanning driving signal of the current stage, an end of the first capacitor is electrically connected to the first node, the other end of the first capacitor is electrically connected to the constant low-level signal.

In the GOA circuit of the present application, the pull-down module comprises: an eighth transistor, a ninth transistor, a tenth transistor, an eleventh transistor, a twelfth transistor, and a second capacitor;

wherein a gate of the eighth transistor is connected to the forward scanning signal, a source of the eighth transistor is electrically connected to the third control clock, a gate of the ninth transistor is connected to the reverse scanning signal, a source of the ninth transistor is electrically connected to the first control clock, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

In the GOA circuit of the present application, the GOA circuit receives a first main clock signal, a second main clock signal, a third main clock signal, and a fourth main clock signal, the first main clock signal, the second main clock signal, the third main clock signal, and the fourth main clock signal are sequentially time-divided in active period of the GOA circuit;

wherein in a (1+8k)th GOA unit and a (2+8k)th GOA unit, the second control clock is connected to the first main clock signal, the third control clock is connected to the second main clock signal, and the first control clock is connected to the fourth main clock signal;

wherein in a (3+8k)th GOA unit and a (4+8k)th GOA unit, the second control clock is connected to the second main clock signal, the third control clock is connected to the third main clock signal, and the first control clock is connected to the first main clock signal;

wherein in a (5+8k)th GOA unit and a (6+8k)th GOA unit, the second control clock is connected to the third main clock signal, the third control clock is connected to the fourth main clock signal, and the first control clock is connected to the second main clock signal;

wherein in a (7+8k)th GOA unit and a (8+8k)th GOA unit, the second control clock is connected to the fourth main clock signal, the third control clock is connected to the first main clock signal, and the first control clock is connected to the third main clock signal; wherein k is a positive integer.

In the GOA circuit of the present application, the GOA circuit receives a first minor clock signal, a second minor clock signal, a third minor clock signal, a fourth minor clock signal, a fifth minor clock signal, a sixth minor clock signal, a seventh minor clock signal, and an eighth minor clock signal, the first minor clock signal, the second minor clock signal, the third minor clock signal, the fourth minor clock signal, the fifth minor clock signal, the sixth minor clock signal, the seventh minor clock signal and the eighth minor clock signal are sequentially time-divided in an active period of the GOA circuit;

wherein in a (1+8k)th GOA unit, the second control clock accesses the first minor clock signal, the third control clock accesses the third minor clock signal, and the first control clock accesses the seventh minor clock signal;

wherein in a (2+8k)th GOA unit, the second control clock accesses the second minor clock signal, the third control clock accesses the fourth minor clock signal, and the first control clock accesses the eighth minor clock signal;

wherein in a (3+8k)th GOA unit, the second control clock accesses the third minor clock signal, the third control clock accesses the fifth minor clock signal, and the first control clock accesses the first minor clock signal;

wherein in a (4+8k)th GOA unit, the second control clock accesses the fourth minor clock signal, the third control clock accesses the sixth minor clock signal, and the first control clock accesses the second minor clock signal;

wherein in a (5+8k)th GOA unit, the second control clock accesses the fifth minor clock signal, the third control clock accesses the seventh minor clock signal, and the first control clock accesses the third minor clock signal;

wherein in a (6+8k)th GOA unit, the second control clock accesses the sixth minor clock signal, the third control clock accesses the eighth minor clock signal, and the first control clock accesses the fourth minor clock signal wherein in a (7+8k)th GOA unit, the second control clock accesses the seventh minor clock signal, the third control clock accesses the first minor clock signal, and the first control clock accesses the fifth minor clock signal;

wherein in a (8+8k)th GOA unit, the second control clock accesses the eighth minor clock signal, the third control clock accesses the second minor clock signal, and the first control clock accesses the sixth minor clock signal;

wherein k is a positive integer.

In the GOA circuit of the present application, the GOA unit further comprises a function control module, the function control module accesses a first function control signal and a second function control signal, and is electrically connected to the first node, the second node, and the current level scan driving signal, the function control module is used for implementing opening functions and shutdown functions of all of scanning drive signals for the GOA circuit.

In the GOA circuit of the present application, the function control module comprises: a thirteenth transistor, a fourteenth transistor, a fifteenth transistor, and a sixteenth transistor;

wherein a gate of the thirteenth transistor, a gate of the fourteenth transistor, and a source and a gate of the fifteenth transistor are connected to the first function control signal, a gate of the sixteenth transistor is connected to the second function control signal, a source of the thirteenth transistor, a source of the fourteenth transistor, and a source of the sixteenth transistor are connected to the constant low-level signal, a drain of the thirteenth transistor is electrically connected to the first node, a drain of the fourteenth transistor is electrically connected to the second node, a drain of the fifteenth transistor and a drain of the sixteenth transistor are electrically connected to a scan driving signal of the current stage.

In the GOA circuit of the present application, the GOA circuit comprises an opening function phase and a shutdown function phase;

wherein in the opening function phase, the first function control signal is at a high level, and the second function control signal is at a low level;

wherein in the shutdown function phase, the first function control signal is at a low level, and the second function control signal is at a high level.

The present application further provides a display panel, wherein comprising a gate driver on array (GOA) circuit, the GOA circuit comprises a multi-level cascaded GOA unit, each level of the GOA unit comprises a forward and reverse scanning module, an output module, and a pull-down module;

wherein the forward and reverse scanning module is connected to a previous-stage scanning driving signal, a forward scanning signal, a next-stage scanning driving signal, a reverse scanning signal, and a constant low-level signal, and is electrically connected to a first control clock, a third control clock, a first node, and a second node, the forward and reverse scanning module is used for outputting the forward scanning signal to the first node, or for outputting the reverse scanning signal to the first node, and outputting the constant low-level signal to the second node a voltage potential control of the first node;

wherein the output module is connected to the constant low-level signal and a constant high-level signal, and is electrically connected to the first node and the second control clock for outputting a scan driving signal of the current stage;

wherein the pull-down module is connected to the constant low-level signal, the forward scanning signal, the reverse scanning signal, and the constant high-level signal, and is electrically connected to the first control clock, the third control clock, the first node, and the scan driving signal of the current stage, the pull-down module is used for pulling down a voltage potential of the first node and a voltage potential of the scan driving signal of the current stage to the constant low-level signal.

In the GOA circuit of the present application, the forward and reverse scanning module comprises a first transistor, a second transistor, a third transistor, a fourth transistor, and a fifth transistor;

wherein a gate of the first transistor is electrically connected to the first control clock, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node.

In the GOA circuit of the present application, the output module comprises a sixth transistor, a seventh transistor, and a first capacitor;

wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock, a drain of the seventh transistor is electrically connected to the scanning driving signal of the current stage, an end of the first capacitor is electrically connected to the first node, the other end of the first capacitor is electrically connected to the constant low-level signal.

In the GOA circuit of the present application, the pull-down module comprises: an eighth transistor, a ninth transistor, a tenth transistor, an eleventh transistor, a twelfth transistor, and a second capacitor;

wherein a gate of the eighth transistor is connected to the forward scanning signal, a source of the eighth transistor is electrically connected to the third control clock, a gate of the ninth transistor is connected to the reverse scanning signal, a source of the ninth transistor is electrically connected to the first control clock, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

The GOA circuit and the display panel provided by an embodiment of the present application use a first control clock and a third control clock in a forward and reverse scanning module to control a first node, thereby avoiding leakage of the first node during operation and improving the reliability of GOA circuit. In addition, in the opening function phase, the first control clock and the third control clock isolate a path from forward scanning signal/reverse scanning signal to the first node, drive with a high-level forward scanning signal/reverse scanning signal while controlling a path of the first node through a first function control signal. Thereby a signal of a second control clock can be connected to an uncontrollable node of the GOA circuit to avoid generating a competition path of the GOA circuit.

BRIEF DESCRIPTION OF THE SEVERAL VIEWS OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DESCRIPTION OF SPECIFIC EMBODIMENTS OF THE INVENTION

Figure 1:
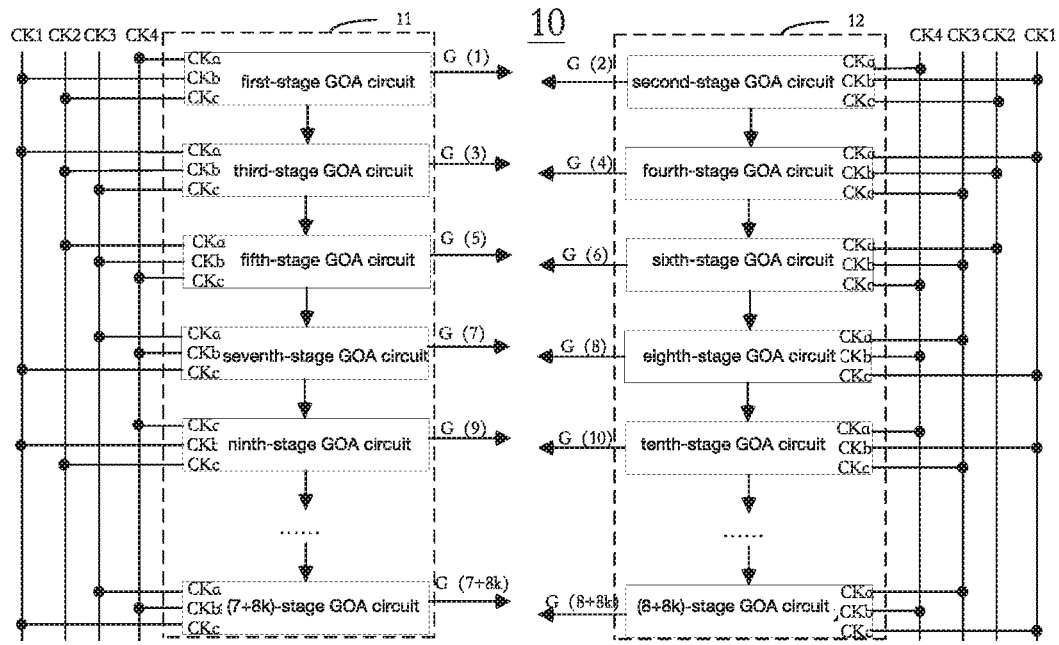
FIG. 1 is a structural diagram of a first structure of a gate driver on array (GOA) circuit according to an embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The transistors used in embodiments of the present application can be thin film transistors or field effect transistors or other devices having the same characteristics. Because a source and a drain of a transistor used here are symmetrical, the source and drain are interchangeable. In the present embodiments of the present application, in order to distinguish two ends of the transistor except a gate, one end is defined to as a source and the other end is defined as a drain. According to a form in the drawings, a middle end of a switching transistor is a gate, a signal input end is a source and an output end is a drain. Furthermore, the transistors used in the embodiments of the present application include P-type transistors and/or N-type transistors, wherein a P-type transistor is turned on when a gate is applied a low level, and is turned off when the gate is applied a high level, a N-type transistor is turned on when a gate is applied a high level and turned off when the gate is applied a low level.

Referring to FIG. 1, FIG. 1 is a structural diagram of a first structure of a gate driver on array (GOA) circuit according to an embodiment of the present application. As shown in FIG. 1, the GOA circuit 10 of the embodiment of the present application includes a multi-level cascaded GOA unit, wherein a nth stage GOA unit is configured to output a nth stage scanning driving signal to charge a corresponding nth scan line in a display region, thereby implementing normal display of the display panel.

The GOA circuit 10 of the present embodiment includes a first GOA sub-circuit 11 formed by cascading odd-numbered GOA units and a second GOA sub-circuit 12 formed by cascading even-numbered GOA units. The GOA circuit of the embodiment adopts an interlaced driving method, and the first GOA sub-circuit 11 and the second GOA sub-circuit 12 output scanning driving signals simultaneously.

Wherein the GOA circuit 10 of the present embodiment receives a first main clock signal CK1, a second main clock signal CK2, a third main clock signal CK3, and a fourth main clock signal CK4, the first main clock signal CK1, the second main clock signal CK2, the third main clock signal CK3, and the fourth main clock signal CK4 are sequentially time-divided in active period of the GOA circuit.

In some embodiments, in a (1+8k)th GOA unit and a (2+8k)th GOA unit, the second control clock CKb is connected to the first main clock signal CK1, the third control clock CKc is connected to the second main clock signal CK2, and the first control clock CKa is connected to the fourth main clock signal CK4, wherein k is a positive integer. For example, in a first stage GOA unit, a second stage GOA unit, a ninth stage GOA unit, and a tenth stage GOA unit, the second control clock CKb is connected to the first main clock signal CK1, the third control clock CKc is connected to the second main clock signal CK2, and the first control clock CKa is connected to the fourth main clock signal CK4.

In some embodiments, in a (3+8k)th GOA unit and a (4+8k)th GOA unit, the second control clock CKb is connected to the second main clock signal CK2, the third control clock CKc is connected to the third main clock signal CK3, and the first control clock CKa is connected to the first main clock signal CK1, wherein k is a positive integer. For example, in a third stage GOA unit and a fourth stage GOA unit, the second control clock CKb is connected to the second main clock signal CK2, the third control clock CKc is connected to the third main clock signal CK3, and the first control clock CKa is connected to the first main clock signal CK1.

In some embodiments, in a (5+8k)th GOA unit and a (6+8k)th GOA unit, the second control clock CKb is connected to the third main clock signal CK3, the third control clock CKc is connected to the fourth main clock signal CK4, and the first control clock CKa is connected to the second main clock signal CK2, wherein k is a positive integer. For example, in a fifth stage GOA unit and a sixth stage GOA unit, the second control clock CKb is connected to the third main clock signal CK3, the third control clock CKc is connected to the fourth main clock signal CK4, and the first control clock CKa is connected to the second main clock signal CK2.

In some embodiments, in a (7+8k)th GOA unit and a (8+8k)th GOA unit, the second control clock CKb is connected to the fourth main clock signal CK4, the third control clock CKc is connected to the first main clock signal CK1, and the first control clock CKa is connected to the third main clock signal CK3, wherein k is a positive integer. For example, in a seventh stage GOA unit and an eighth stage GOA unit, the second control clock CKb is connected to the fourth main clock signal CK4, the third control clock CKc is connected to the first main clock signal CK1, and the first control clock CKa is connected to the third main clock signal CK3.

Figure 2:
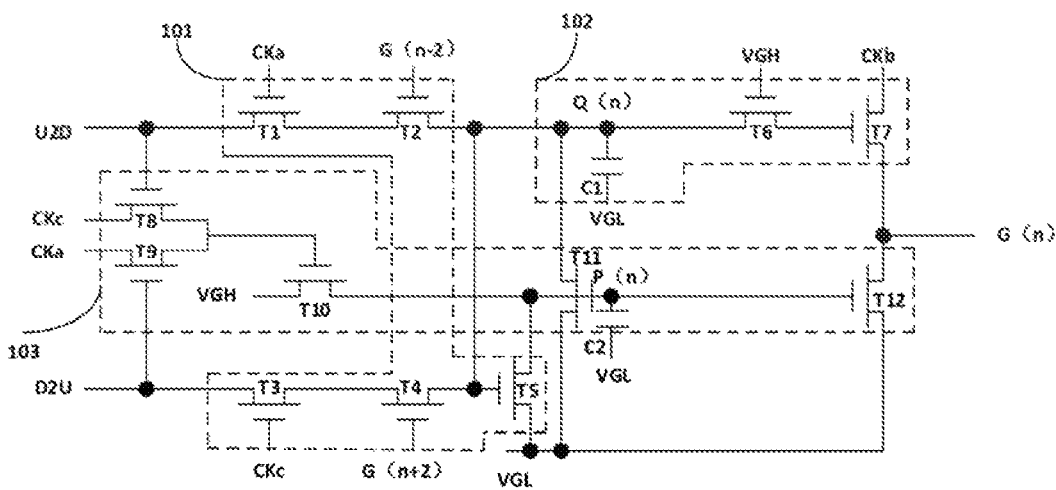
FIG. 2 is a first circuit diagram of a GOA unit in the GOA circuit of FIG. 1.

Further, referring to FIG. 2, FIG. 2 is a first circuit diagram of a GOA unit in the GOA circuit of FIG. 1. As shown in FIG. 1 and FIG. 2, the GOA unit includes a forward/reverse scanning module 101, an output module 102, and a pull-down module 103.

Wherein the forward and reverse scanning module 101 is connected to a previous-stage scanning driving signal G(n−2), a forward scanning signal U2D, a next-stage scanning driving signal G(n+2), a reverse scanning signal D2U1, and a constant low-level signal VGL, and is electrically connected to a first control clock CKa, a third control clock CKc, a first node Q(n), and a second node P(n), the forward and reverse scanning module 101 is used for outputting the forward scanning signal U2D to the first node Q(n), or for outputting the reverse scanning signal D2U1 to the first node Q(n), and outputting the constant low-level signal VGL to the second node P(n) a voltage potential control of the first node Q(n).

Wherein the output module is connected to the constant low-level signal VGL and a constant high-level signal VGH and is electrically connected to the first node Q(n) and the second control clock CKb for outputting a scan driving signal of the current stage.

Wherein the pull-down module 103 is connected to the constant low-level signal VGL, the forward scanning signal U2D, the reverse scanning signal D2U1, and the constant high-level signal VGH, and is electrically connected to the first control clock CKa, the third control clock CKc, the first node Q(n), and the scan driving signal of the current stage, the pull-down module is used for pulling down a voltage potential of the first node Q(n) and a voltage potential of the scan driving signal of the current stage to the constant low-level signal VGL.

wherein the forward and reverse scanning module 101 includes a first transistor T1, a second transistor T2, a third transistor T3, a fourth transistor T4, and a fifth transistor T5.

Wherein a gate of the first transistor T1 is electrically connected to the first control clock CKa, a source of the first transistor T1 is connected to the forward scanning signal U2D, a drain of the first transistor T1 is electrically connected to a source of the second transistor T2, a gate of the second transistor T2 is connected to the upper scan driving signal, a drain of the second transistor T2 is electrically connected to the first node Q(n), a gate of the third transistor T3 is electrically connected to the third control clock CKc, a source of the third transistor T3 is connected to the reverse scanning signal D2U1, a drain of the third transistor T3 is electrically connected to a source of the fourth transistor T4, a gate of the fourth transistor T4 is connected to a scanning driving signal of the next stage, a drain of the fourth transistor T4 is electrically connected to the first node Q(n), a gate of the fifth transistor T5 is electrically connected to the first node Q(n), a source of the fifth transistor T5 is connected to the constant low-level signal VGL, a drain of the fifth transistor T5 is electrically connected to the second node P(n).

The output module 102 includes a sixth transistor T6, a seventh transistor T7, and a first capacitor C1.

Wherein a gate of the sixth transistor T6 is connected to the constant high-level signal VGH, a source of the sixth transistor T6 is electrically connected to the first node Q(n), a drain of the sixth transistor T6 is electrically connected to a gate of the seventh transistor T7, a source of the seventh transistor T7 is electrically connected to the first control clock CKa, a drain of the seventh transistor T7 is electrically connected to the scanning driving signal of the current stage, an end of the first capacitor C1 is electrically connected to the first node Q(n), the other end of the first capacitor C1 is electrically connected to the constant low-level signal VGL.

The pull-down module 103 includes an eighth transistor T8, a ninth transistor T9, a tenth transistor T10, an eleventh transistor T11, a twelfth transistor T12, and a second capacitor C2.

Wherein a gate of the eighth transistor T8 is connected to the forward scanning signal, a source of the eighth transistor T8 is electrically connected to the third control clock CKc, a gate of the ninth transistor T9 is connected to the reverse scanning signal D2U1, a source of the ninth transistor T9 is electrically connected to the first control clock CKa, a drain of the eighth transistor T8 and a drain of the ninth transistor T9 are electrically connected to a gate of the tenth transistor T10, a source of the tenth transistor T10 is connected to the constant high-level signal VGH, a drain of the tenth transistor T10, a gate of the eleventh transistor T11, and a gate of the twelfth transistor T12 are electrically connected to the second node P(n), a source of the eleventh transistor T11 and a source of the twelfth transistor T12 are connected to the constant low-level signal VGL, a drain of the eleventh transistor T11 is electrically connected to the first node Q(n), a drain of the twelfth transistor T12 is electrically connected to the scan driving signal of the current stage, an end of the second capacitor C2 is electrically connected to the second node P(n), and the other end of the second capacitor C2 is electrically connected to the constant low-level signal VGL.

Figure 3:
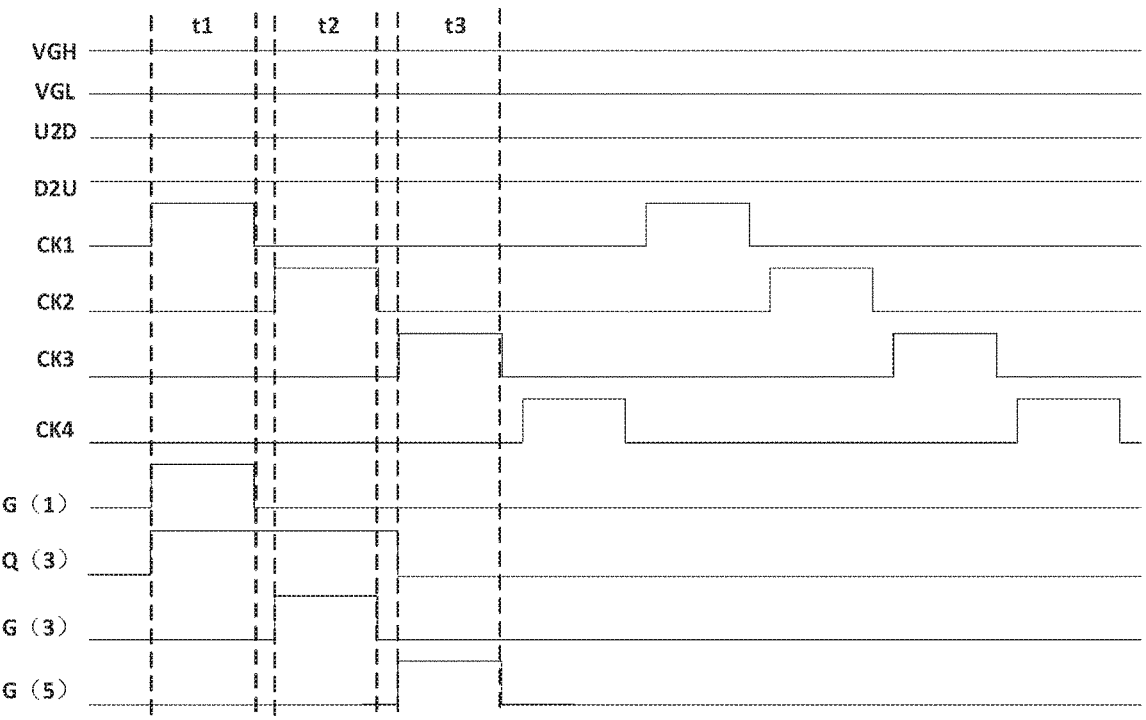
FIG. 3 is a timing diagram of a 3th stage GOA unit corresponding to the GOA circuit of FIG. 1.

A working principle of a third-stage GOA unit corresponding to the GOA circuit shown in FIG. 1 will be described below by taking the third-stage GOA unit as an example. Referring to FIG. 3, FIG. 3 is a timing diagram of a third-stage GOA unit corresponding to the GOA circuit shown in FIG. 1. Wherein the first main clock signal CK1, the second main clock signal CK2, the third main clock signal CK3, and the fourth main clock signal CK4 are clock signals with a same period and different phases. It should be noted that in the third-stag GOA unit, the second control clock CKb is connected to the second main clock signal CK2, the third control clock CKc is connected to the third main clock signal CK3, and the first control clock CKa is connected to the first main clock signal CK1.

As shown in FIG. 1, FIG. 2 and FIG. 3, when the GOA circuit performs forward scanning, the forward scanning signal U2D is at a high level, and the reverse scanning signal D2U is at a low level. In a first period t1, the first main clock signal CK1 is at a high level, and the previous-stage scan driving signal G1 is at a high level. At this time, the first transistor T1 and the second transistor T2 are turned on, and the forward scanning signal U2D is output to the first node Q(3) through the first transistor T1 and the second transistor T2, and a voltage potential of the first node Q(3) is raised. Because the voltage potential of the first node Q(3) is raised, the fifth transistor T5 is turned on, and the constant low level signal is output to the second node P(3), so that the eleventh transistor T11 and the twelfth transistor T12 are turned off. At the same time, because the voltage potential of the first node Q(3) is raised, the seventh transistor T7 is turned on, the second main clock signal CK2 is at a low voltage potential, and the second main clock signal CK2 is output through the seventh transistor T7, so that a current-stage scan driving signal G(3) is at a low voltage potential.

In a second period t2, due to the effect of the first capacitor C1 and the second capacitor C2, the voltage potential of the first node Q(3) is still high, and the voltage potential of the second node P(3) is still low. At this time, the second main clock signal CK2 is high, and the second main clock signal CK2 is output through the seventh transistor T7, so that the current-stage scan driving signal G(3) is at a high voltage potential.

In a third time period t3, the third main clock signal CK3 is high, so that the tenth transistor T10 is turned on, and the constant high level signal VGH is output to the second node P(3) through the tenth transistor T10. The eleventh transistor T11 and the twelfth transistor T12 are turned on, and the constant low level signal VGL is output to the first node Q(3) via the eleventh transistor T11. The constant low level signal VGL is output to the first-stage scanning driving signal G(3) through the twelfth transistor T12. At this time, the voltage potential of the first node Q(3) and the voltage potential of the scanning drive signal G(3) of the present stage are pulled down to the voltage potential of the constant low level signal VGL.

Similarly, when the GOA circuit performs a reverse scanning, the forward scanning signal U2D is at a low level, and the reverse scanning signal D2U is at a high level. In the third time period t3, the third main clock signal CK3 is at a high level, and the next-stage scanning driving signal G5 is at a high level. At this time, the third transistor T3 and the fourth transistor T4 are turned on, and the reverse scanning signal D2U is output to the first node Q(3) via the third transistor T3 and the fourth transistor T4, and the voltage potential of the first node Q(3) is raised. Because the voltage potential of the first node Q(3) is raised, the fifth transistor T5 is turned on, and the constant low level signal is output to the second node P(3), so that the eleventh transistor T11 and the twelfth transistor T12 are turned off. At the same time, since the voltage potential of the first node Q(3) is raised, the seventh transistor T7 is turned on. The second main clock signal CK2 is at a low level, and the second main clock signal CK2 is output through the seventh transistor T7, so that the current-stage scanning driving signal G(3) is at a low voltage potential.

In the second period t2, due to the effect of the first capacitor C1 and the second capacitor C2, the voltage potential of the first node Q(3) is still high, and the voltage potential of the second node P(3) is still low. At this time, the second main clock signal CK2 is at a high level, and the second main clock signal CK2 is output through the seventh transistor T7, so that the current-stage scanning driving signal G(3) is at a high voltage potential.

In the first time period t1, the first main clock signal CK1 is at a high level, so that the tenth transistor T10 is turned on, and the constant high level signal VGH is output to the second node P(3) via the tenth transistor T10. The eleventh transistor T11 and the twelfth transistor T12 are turned on, and the constant low level signal VGL is output to the first node Q(3) via the eleventh transistor T11. The constant low level signal VGL is output to the first-stage scanning driving signal G(3) via the twelfth transistor T12. At this time, the voltage potential of the first node Q(3) and the voltage potential of the scanning drive signal G(3) of the present stage are pulled down to the voltage potential of the constant voltage low level signal VGL.

It should be noted that the GOA circuit 10 of the embodiment of the present application controls the first node Q(n) by adding the first control clock CKa and the third control clock CKc in the forward and reverse scanning module 101, thereby avoiding leakage of first node Q(n) during operation and improving the reliability of the GOA circuit 10.

Figure 4:
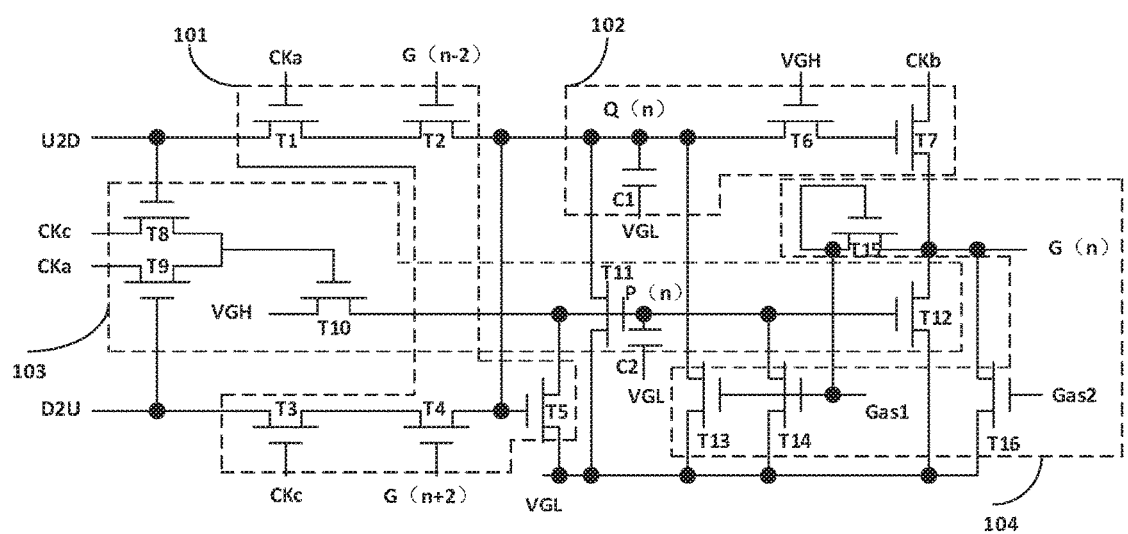
FIG. 4 is a second circuit diagram of a GOA unit in the GOA circuit of FIG. 1.

Referring to FIG. 4, FIG. 4 is a schematic diagram of a second circuit of a GOA unit in the GOA circuit shown in FIG. 1. The difference between the GOA unit in FIG. 4 and the GOA unit in FIG. 2 is that the GOA unit in FIG. 4 further includes a function control module 104. The function control module 104 accesses a first function control signal Gas1 and a second function control signal Gas2, and is electrically connected to the first node Q(n), the second node P(n), and the current level scan driving signal, the function control module 104 is used for implementing opening functions and shutdown functions of all of scanning drive signals for the GOA circuit.

The function control module 104 includes a thirteenth transistor T13, a fourteenth transistor T14, a fifteenth transistor T15, and a sixteenth transistor T16.

Wherein a gate of the thirteenth transistor T13, a gate of the fourteenth transistor T14, and a source and a gate of the fifteenth transistor T15 are connected to the first function control signal Gas1, a gate of the sixteenth transistor T16 is connected to the second function control signal Gas2, a source of the thirteenth transistor T13, a source of the fourteenth transistor T14, and a source of the sixteenth transistor T16 are connected to the constant low-level signal VGL, a drain of the thirteenth transistor T13 is electrically connected to the first node Q(n), a drain of the fourteenth transistor T14 is electrically connected to the second node P(n), a drain of the fifteenth transistor T15 and a drain of the sixteenth transistor T16 are electrically connected to a scan driving signal of the current stage G(n).

The GOA circuit 10 includes an opening function phase and a shutdown function phase. Wherein in the opening function phase, the first function control signal Gas1 is at a high level, and the second function control signal Gas2 is at a low level. Wherein in the shutdown function phase, the first function control signal Gas1 is at a low level, and the second function control signal Gas2 is at a high level.

It should be noted that, in the opening function phase, the first control clock CKa and the third control clock CKc isolate a path from forward scanning signal U2D/reverse scanning signal D2U to the first node, drive with a high-level forward scanning signal U2D/reverse scanning signal D2U while controlling a path of the first node through a first function control signal Gas1. Thereby a signal of a second control clock CKb can be connected to an uncontrollable node of the GOA circuit to avoid generating a competition path of the GOA circuit 10.

Figure 5:
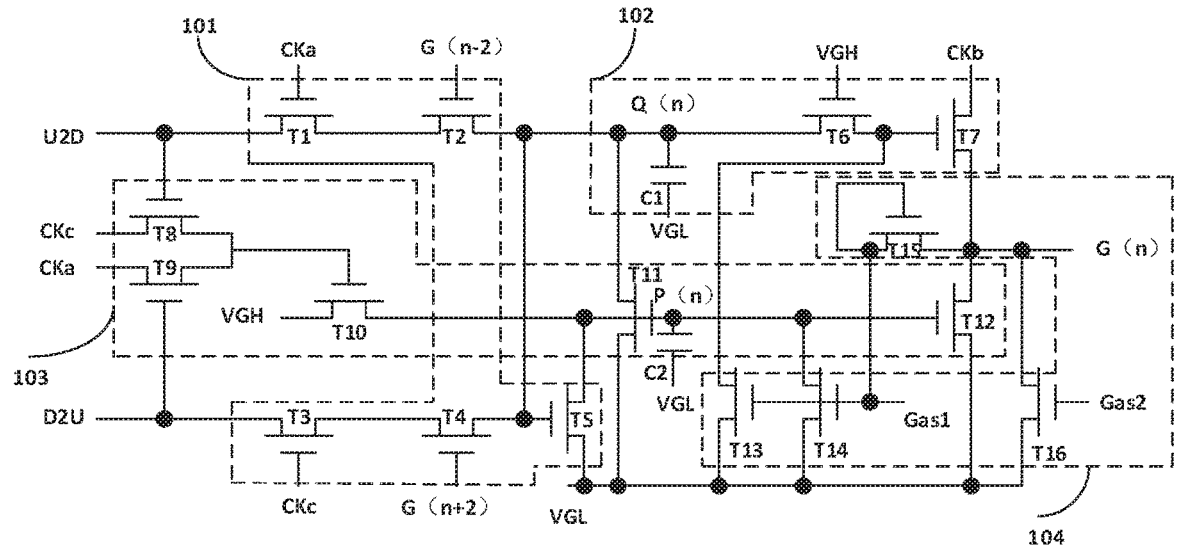
FIG. 5 is a third circuit diagram of a GOA unit in the GOA circuit of FIG. 1.

Referring to FIG. 5, FIG. 5 is a third circuit diagram of a GOA unit in the GOA circuit shown in FIG. 1. The difference between the GOA unit in FIG. 5 and the GOA unit in FIG. 4 is the drain of the thirteenth transistor T13 in FIG. 4 is electrically connected to the source of the sixth transistor T6 and the drain of the thirteenth transistor T13 in FIG. 5 is electrically connected to the drain of the sixth transistor T6. Operation principles of the GOA unit in FIG. 5 are the same with the GOA unit in FIG. 4 and will not be described herein because the gate of the sixth transistor T6 is connected to the constant high level signal VGH.

Figure 6:
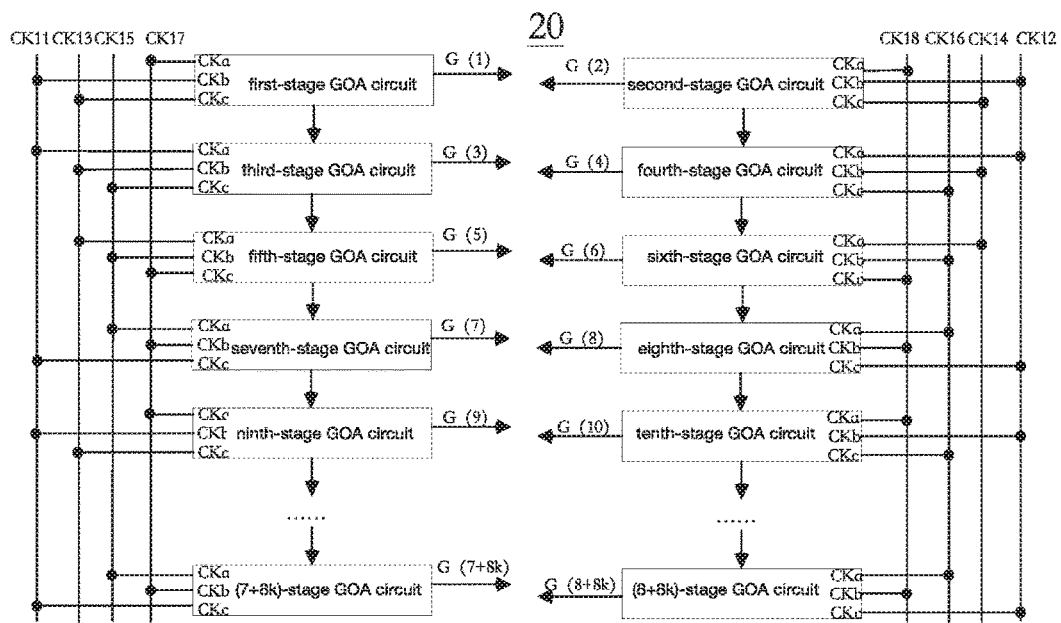
FIG. 6 is a structural diagram of a second structure of a GOA circuit according to an embodiment of the present application.

Referring to FIG. 6, FIG. 6 is a schematic diagram of a second structure of a GOA circuit according to an embodiment of the present application. The difference between the GOA circuit 20 in FIG. 6 and the GOA circuit 10 in FIG. 1 is that the clock signals connected to the first control clock CKa, the second control clock CKb, and the third control clock CKc are different.

Wherein the GOA circuit 20 receives a first minor clock signal CK11, a second minor clock signal CK12, a third minor clock signal CK13, a fourth minor clock signal CK14, a fifth minor clock signal CK15, a sixth minor clock signal CK16, a seventh minor clock signal CK17, and an eighth minor clock signal CK18, the first minor clock signal CK11, the second minor clock signal CK12, the third minor clock signal CK13, the fourth minor clock signal CK14, the fifth minor clock signal CK15, the sixth minor clock signal CK16, the seventh minor clock signal CK17 and the eighth minor clock signal CK18 are sequentially time-divided in an active period of the GOA circuit.

In some embodiments, in a (1+8k)th GOA unit, the second control clock CKb accesses the first minor clock signal CK11, the third control clock CKc accesses the third minor clock signal CK13, and the first control clock CKa accesses the seventh minor clock signal CK17, wherein k is a positive integer. For example, in the first-stage GOA unit and the ninth-stage GOA unit, the second control clock CKb accesses the first minor clock signal CK11, the third control clock CKc accesses the third minor clock signal CK13, and the first control clock CKa accesses the seventh minor clock signal CK17.

In some embodiments, in a (2+8k)th GOA unit, the second control clock CKb accesses the second minor clock signal CK12, the third control clock CKc accesses the fourth minor clock signal CK14, and the first control clock CKa accesses the eighth minor clock signal CK18, wherein k is a positive integer. For example, in the second-stage GOA unit and the tenth-stage GOA unit, the second control clock CKb accesses the second minor clock signal CK12, the third control clock CKc accesses the fourth minor clock signal CK14, and the first control clock CKa accesses the eighth minor clock signal CK18.

In some embodiments, in a (3+8k)th GOA unit, the second control clock CKb accesses the third minor clock signal CK13, the third control clock CKc accesses the fifth minor clock signal CK15, and the first control clock CKa accesses the first minor clock signal CK11, wherein k is a positive integer. For example, in the third-stage GOA unit, the second control clock CKb accesses the third minor clock signal CK13, the third control clock CKc accesses the fifth minor clock signal CK15, and the first control clock CKa accesses the first minor clock signal CK11.

In some embodiments, in a (4+8k)th GOA unit, the second control clock CKb accesses the fourth minor clock signal CK14, the third control clock CKc accesses the sixth minor clock signal CK16, and the first control clock CKa accesses the second minor clock signal CK12, wherein k is a positive integer. For example, in the fourth-stage GOA unit, the second control clock CKb accesses the fourth minor clock signal CK14, the third control clock CKc accesses the sixth minor clock signal CK16, and the first control clock CKa accesses the second minor clock signal CK12.

In some embodiments, in a (5+8k)th GOA unit, the second control clock CKb accesses the fifth minor clock signal CK15, the third control clock CKc accesses the seventh minor clock signal CK17, and the first control clock CKa accesses the third minor clock signal CK13, wherein k is a positive integer. For example, in the fifth-stage GOA unit, the second control clock CKb accesses the fifth minor clock signal CK15, the third control clock CKc accesses the seventh minor clock signal CK17, and the first control clock CKa accesses the third minor clock signal CK13.

In some embodiments, in a (6+8k)th GOA unit, the second control clock CKb accesses the sixth minor clock signal CK16, the third control clock CKc accesses the eighth minor clock signal CK18, and the first control clock CKa accesses the fourth minor clock signal CK1, wherein k is a positive integer. For example, in the sixth-stage GOA unit, the second control clock CKb accesses the sixth minor clock signal CK16, the third control clock CKc accesses the eighth minor clock signal CK18, and the first control clock CKa accesses the fourth minor clock signal CK1.

In some embodiments, in a (7+8k)th GOA unit, the second control clock CKb accesses the seventh minor clock signal CK17, the third control clock CKc accesses the first minor clock signal CK11, and the first control clock CKa accesses the fifth minor clock signal CK15, wherein k is a positive integer. For example, in the seventh-stage GOA unit, the second control clock CKb accesses the seventh minor clock signal CK17, the third control clock CKc accesses the first minor clock signal CK11, and the first control clock CKa accesses the fifth minor clock signal CK15.

In some embodiments, in a (8+8k)th GOA unit, the second control clock CKb accesses the eighth minor clock signal CK18, the third control clock CKc accesses the second minor clock signal CK12, and the first control clock CKa accesses the sixth minor clock signal CK16, wherein k is a positive integer. For example, in the eighth-stage GOA unit, the second control clock CKb accesses the eighth minor clock signal CK18, the third control clock CKc accesses the second minor clock signal CK12, and the first control clock CKa accesses the sixth minor clock signal CK16.

It should be noted that the circuit diagram of the GOA unit in the GOA circuit 20 in FIG. 6 is identical to the circuit diagram of the GOA unit in the GOA circuit 10 shown in FIG. 1. For details, referring to FIG. 2, FIG. 4, and FIG. 5, the description will not repeat here.

The working principle of the third-stage GOA unit corresponding to the GOA circuit in FIG. 6 will be described below by taking the third-stage GOA unit as an example.

Figure 7:
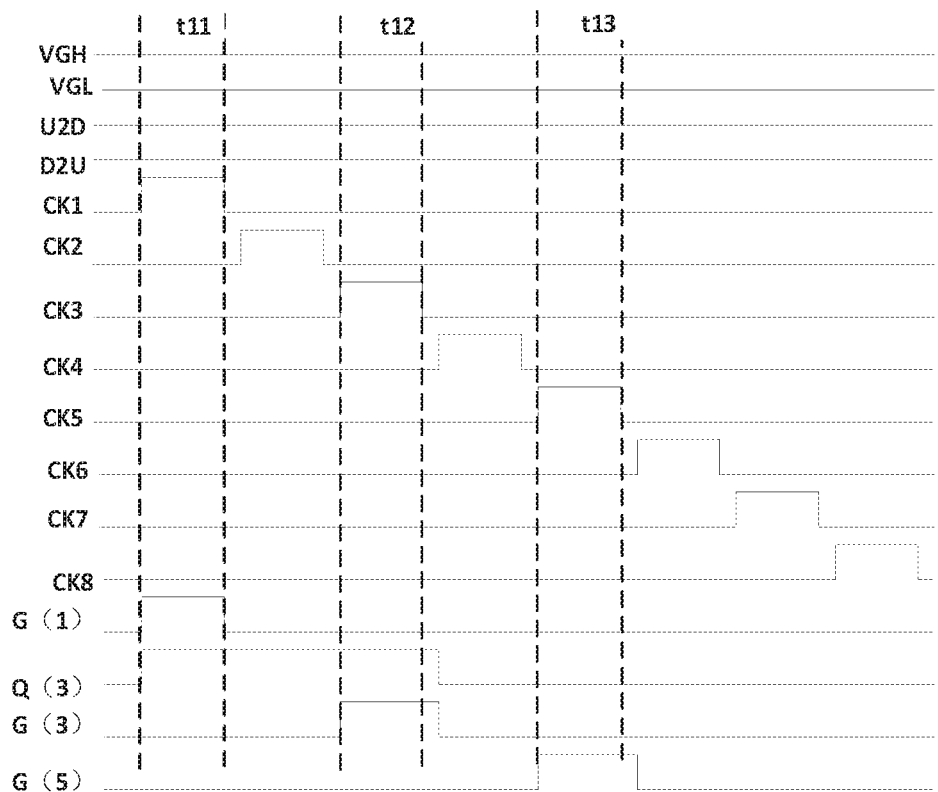
FIG. 7 is a timing diagram of a 3th stage GOA unit corresponding to the GOA circuit of FIG. 6.

Referring to FIG. 7, FIG. 7 is a timing diagram of a third-stage GOA unit corresponding to the GOA circuit in FIG. 6. Wherein the first minor clock signal CK11, the second minor clock signal CK12, the third minor clock signal CK13, the fourth minor clock signal CK14, the fifth minor clock signal CK15, the sixth minor clock signal CK16, the seventh minor clock signal CK17 and the eighth minor clock signal CK18 are clock signals with a same period and different phases. It should be noted that in the third-stage GOA unit, the second control clock CKb accesses the third minor clock signal CK13, the third control clock CKc accesses the fifth minor clock signal CK15, and the first control clock CKa accesses the first minor clock signal CK11.

As shown in FIG. 6, FIG. 7 and FIG. 3, when the GOA circuit performs forward scanning, the forward scanning signal U2D is at a high level, and the reverse scanning signal D2U is at a low level. In a first period t11, the first minor clock signal CK11 is at a high level, and the previous-stage scan driving signal G1 is at a high level. At this time, the first transistor T1 and the second transistor T2 are turned on, and the forward scanning signal U2D is output to the first node Q(3) through the first transistor T1 and the second transistor T2, and a voltage potential of the first node Q(3) is raised. Because the voltage potential of the first node Q(3) is raised, the fifth transistor T5 is turned on, and the constant low level signal is output to the second node P(3), so that the eleventh transistor T11 and the twelfth transistor T12 are turned off. At the same time, because the voltage potential of the first node Q(3) is raised, the seventh transistor T7 is turned on, the third minor clock signal CK13 is at a low voltage potential, and the third minor clock signal CK13 is output through the seventh transistor T7, so that a current-stage scan driving signal G(3) is at a low voltage potential.

In a second period t12, due to the effect of the first capacitor C1 and the second capacitor C2, the voltage potential of the first node Q(3) is still high, and the voltage potential of the second node P(3) is still low. At this time, the third minor clock signal CK13 is high, and the third minor clock signal CK13 is output through the seventh transistor T7, so that the current-stage scan driving signal G(3) is at a high voltage potential.

In a third time period t13, the fifth minor clock signal CK15 is high, so that the tenth transistor T10 is turned on, and the constant high level signal VGH is output to the second node P(3) through the tenth transistor T10. The eleventh transistor T11 and the twelfth transistor T12 are turned on, and the constant low level signal VGL is output to the first node Q(3) via the eleventh transistor T11. The constant low level signal VGL is output to the first-stage scanning driving signal G(3) through the twelfth transistor T12. At this time, the voltage potential of the first node Q(3) and the voltage potential of the scanning drive signal G(3)

of the present stage are pulled down to the voltage potential of the constant low level signal VGL.

Similarly, when the GOA circuit performs a reverse scanning, the forward scanning signal U2D is at a low level, and the reverse scanning signal D2U is at a high level. In the third time period t13, the fifth minor clock signal CK15 is at a high level, and the next-stage scanning driving signal G5 is at a high level. At this time, the third transistor T3 and the fourth transistor T4 are turned on, and the reverse scanning signal D2U is output to the first node Q(3) via the third transistor T3 and the fourth transistor T4, and the voltage potential of the first node Q(3) is raised. Because the voltage potential of the first node Q(3) is raised, the fifth transistor T5 is turned on, and the constant low level signal is output to the second node P(3), so that the eleventh transistor T11 and the twelfth transistor T12 are turned off. At the same time, since the voltage potential of the first node Q(3) is raised, the seventh transistor T7 is turned on. The third minor clock signal CK13 is at a low level, and the third minor clock signal CK13 is output through the seventh transistor T7, so that the current-stage scanning driving signal G(3) is at a low voltage potential.

In the second period t12, due to the effect of the first capacitor C1 and the second capacitor C2, the voltage potential of the first node Q(3) is still high, and the voltage potential of the second node P(3) is still low. At this time, the third minor clock signal CK13 is at a high level, and the third minor clock signal CK13 is output through the seventh transistor T7, so that the current-stage scanning driving signal G(3) is at a high voltage potential.

In the first time period t11, the first minor clock signal CK11 is at a high level, so that the tenth transistor T10 is turned on, and the constant high level signal VGH is output to the second node P(3) via the tenth transistor T10. The eleventh transistor T11 and the twelfth transistor T12 are turned on, and the constant low level signal VGL is output to the first node Q(3) via the eleventh transistor T11. The constant low level signal VGL is output to the first-stage scanning driving signal G(3) via the twelfth transistor T12. At this time, the voltage potential of the first node Q(3) and the voltage potential of the scanning drive signal G(3) of the present stage are pulled down to the voltage potential of the constant voltage low level signal VGL.

Figure 8:
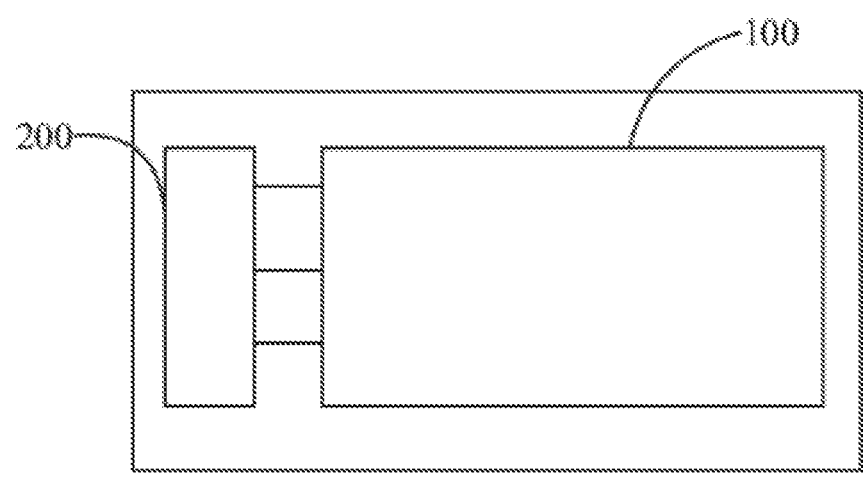
FIG. 8 is a structural diagram of a display panel according to an embodiment of the present application.

Referring to FIG. 8, FIG. 8 is a structural diagram of a display panel according to an embodiment of the present application. As shown in FIG. 8, the display panel includes a display region 100 and a GOA circuit 200 integrally disposed on an edge of the display region 100. The structure and principle of the GOA circuit 200 are similar to those of the GOA circuit described above and are not described herein again.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A gate driver on array (GOA) circuit, comprising a multi-level cascaded GOA unit, each level of the GOA unit comprises a forward and reverse scanning module, an output module, and a pull-down module;
   wherein the forward and reverse scanning module is connected to a first-level scan driving signal, a forward scanning signal, a next-stage scanning driving signal, a reverse scanning signal, and a constant low-level signal, and is electrically connected to a first control clock end, a third control clock end, a first node, and a second node, the forward and reverse scanning module is used for outputting the forward scanning signal to the first node, or for outputting the reverse scanning signal to the first node, and outputting the constant low-level signal to the second node a voltage potential control of the first node;
   wherein the output module is connected to the constant low-level signal and a constant high-level signal, and is electrically connected to the first node and the second control clock end for outputting a scan driving signal of the current stage;
   wherein the pull-down module is connected to the constant low-level signal, the forward scanning signal, the reverse scanning signal, and the constant high-level signal, and is electrically connected to the first control clock end, the third control clock end, the first node, and the scan driving signal of the current stage, the pull-down module is used for pulling down a voltage potential of the first node and a voltage potential of the scan driving signal of the current stage to the constant low-level signal;
   wherein the forward and reverse scanning module comprises a first transistor, a second transistor, a third transistor, a fourth transistor, and a fifth transistor;
   wherein a gate of the first transistor is electrically connected to the first control clock end, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock end, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node;
   wherein the output module comprises a sixth transistor, a seventh transistor, and a first capacitor;
   wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock end, a drain of the seventh transistor is electrically connected to the scanning driving signal of the current stage, an end of the first capacitor is electrically connected to the first node, the other end of the first capacitor is electrically connected to the constant low-level signal.

2. The GOA circuit according to claim 1, wherein the pull-down module comprises: an eighth transistor, a ninth transistor, a tenth transistor, an eleventh transistor, a twelfth transistor, and a second capacitor;
   wherein a gate of the eighth transistor is connected to the forward scan signal, a source of the eighth transistor is electrically connected to the third control clock end, a gate of the ninth transistor is connected to the reverse scanning signal, a source of the ninth transistor is electrically connected to the first control clock end, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

3. The GOA circuit according to claim 1, wherein the GOA circuit receives a first main clock signal, a second main clock signal, a third main clock signal, and a fourth main clock signal, the first main clock signal, the second main clock signal, the third main clock signal, and the fourth main clock signal are sequentially time-divided in active period of the GOA circuit;

wherein in a (1+8k)th GOA unit and a (2+8k)th GOA unit, the second control clock end is connected to the first main clock signal, the third control clock end is connected to the second main clock signal, and the first control clock end is connected to the fourth main clock signal;

wherein in a (3+8k)th GOA unit and a (4+8k)th GOA unit, the second control clock end is connected to the second main clock signal, the third control clock end is connected to the third main clock signal, and the first control clock end is connected to the first main clock signal;

wherein in a (5+8k)th GOA unit and a (6+8k)th GOA unit, the second control clock end is connected to the third main clock signal, the third control clock end is connected to the fourth main clock signal, and the first control clock end is connected to the second main clock signal;

wherein in a (7+8k)th GOA unit and a (8+8k)th GOA unit, the second control clock end is connected to the fourth main clock signal, the third control clock end is connected to the first main clock signal, and the first control clock end is connected to the third main clock signal; wherein k is a positive integer.

4. The GOA circuit according to claim 1, wherein the GOA circuit receives a first minor clock signal, a second minor clock signal, a third minor clock signal, a fourth minor clock signal, a fifth minor clock signal, a sixth minor clock signal, a seventh minor clock signal, and an eighth minor clock signal, the first minor clock signal, the second minor clock signal, the third minor clock signal, the fourth minor clock signal, the fifth minor clock signal, the sixth minor clock signal, the seventh minor clock signal and the eighth minor clock signal is sequentially time-divided in an active period of the GOA circuit;

wherein in a (1+8k)th GOA unit, the second control clock end accesses the first minor clock signal, the third control clock end accesses the third minor clock signal, and the first control clock end accesses the seventh minor clock signal;

wherein in a (2+8k)th GOA unit, the second control clock end accesses the second minor clock signal, the third control clock end accesses the fourth minor clock signal, and the first control clock end accesses the eighth minor clock signal;

wherein in a (3+8k)th GOA unit, the second control clock end accesses the third minor clock signal, the third control clock end accesses the fifth minor clock signal, and the first control clock end accesses the first minor clock signal;

wherein in a (4+8k)th GOA unit, the second control clock end accesses the fourth minor clock signal, the third control clock end accesses the sixth minor clock signal, and the first control clock end accesses the second minor clock signal;

wherein in a (5+8k)th GOA unit, the second control clock end accesses the fifth minor clock signal, the third control clock end accesses the seventh minor clock signal, and the first control clock end accesses the third minor clock signal;

wherein in a (6+8k)th GOA unit, the second control clock end accesses the sixth minor clock signal, the third control clock end accesses the eighth minor clock signal, and the first control clock end accesses the fourth minor clock signal wherein in a (7+8k)th GOA unit, the second control clock end accesses the seventh minor clock signal, the third control clock end accesses the first minor clock signal, and the first control clock end accesses the fifth minor clock signal;

wherein in a (8+8k)th GOA unit, the second control clock end accesses the eighth minor clock signal, the third control clock end accesses the second minor clock signal, and the first control clock end accesses the sixth minor clock signal;

wherein k is a positive integer.

5. The GOA circuit according to claim 1, wherein the GOA unit further comprises a function control module, the function control module accesses a first function control signal and a second function control signal, and is electrically connected to the first node, the second node, and the current level scan driving signal, the function control module is used for implementing opening functions and shut-down functions of all of scanning drive signals for the GOA circuit.

6. The GOA circuit according to claim 5, wherein the function control module comprises: a thirteenth transistor, a fourteenth transistor, a fifteenth transistor, and a sixteenth transistor;

wherein a gate of the thirteenth transistor, a gate of the fourteenth transistor, and a source and a gate of the fifteenth transistor are connected to the first function control signal, a gate of the sixteenth transistor is connected to the second function control signal, a source of the thirteenth transistor, a source of the fourteenth transistor, and a source of the sixteenth transistor are connected to the constant low-level signal, a drain of the thirteenth transistor is electrically connected to the first node, a drain of the fourteenth transistor is electrically connected to the second node, a drain of the fifteenth transistor and a drain of the sixteenth transistor are electrically connected to a scan driving signal of the current stage.

7. The GOA circuit according to claim 6, wherein the GOA circuit comprises an open function phase and a shut-down function phase;

wherein in the opening function phase, the first function control signal is at a high level, and the second function control signal is at a low level;

wherein in the shutdown function phase, the first function control signal is at a low level, and the second function control signal is at a high level.

8. A gate driver on array (GOA) circuit, comprising a multi-level cascaded GOA unit, each level of the GOA unit comprises a forward and reverse scanning module, an output module, and a pull-down module;

wherein the forward and reverse scanning module is connected to a first-level scan driving signal, a forward scanning signal, a next-stage scanning driving signal, a reverse scanning signal, and a constant low-level signal, and is electrically connected to a first control clock end, a third control clock end, a first node, and a second node, the forward and reverse scanning module is used for outputting the forward scanning signal to the first node, or for outputting the reverse scanning signal to the first node, and outputting the constant low-level signal to the second node a voltage potential control of the first node;

wherein the output module is connected to the constant low-level signal and a constant high-level signal, and is electrically connected to the first node and the second control clock end for outputting a scan driving signal of the current stage;

wherein the pull-down module is connected to the constant low-level signal, the forward scanning signal, the reverse scanning signal, and the constant high-level signal, and is electrically connected to the first control clock end, the third control clock end, the first node, and the scan driving signal of the current stage, the pull-down module is used for pulling down a voltage potential of the first node and a voltage potential of the scan driving signal of the current stage to the constant low-level signal.

9. The GOA circuit according to claim 8, wherein the forward and reverse scanning module comprises a first transistor, a second transistor, a third transistor, a fourth transistor, and a fifth transistor;

wherein a gate of the first transistor is electrically connected to the first control clock end, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock end, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node.

10. The GOA circuit according to claim 8, wherein the output module comprises a sixth transistor, a seventh transistor, and a first capacitor;

wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock end, a drain of the seventh transistor is electrically connected to the scanning driving signal of the current stage, an end of the first capacitor is electrically connected to the first node, the other end of the first capacitor is electrically connected to the constant low-level signal.

11. The GOA circuit according to claim 8, wherein the pull-down module comprises: an eighth transistor, a ninth transistor, a tenth transistor, an eleventh transistor, a twelfth transistor, and a second capacitor;

wherein a gate of the eighth transistor is connected to the forward scan signal, a source of the eighth transistor is electrically connected to the third control clock end, a gate of the ninth transistor is connected to the reverse scanning signal, a source of the ninth transistor is electrically connected to the first control clock end, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

12. The GOA circuit according to claim 8, wherein the GOA circuit receives a first main clock signal, a second main clock signal, a third main clock signal, and a fourth main clock signal, the first main clock signal, the second main clock signal, the third main clock signal, and the fourth main clock signal are sequentially time-divided in active period of the GOA circuit;

wherein in a (1+8k)th GOA unit and a (2+8k)th GOA unit, the second control clock end is connected to the first main clock signal, the third control clock end is connected to the second main clock signal, and the first control clock end is connected to the fourth main clock signal;

wherein in a (3+8k)th GOA unit and a (4+8k)th GOA unit, the second control clock end is connected to the second main clock signal, the third control clock end is connected to the third main clock signal, and the first control clock end is connected to the first main clock signal;

wherein in a (5+8k)th GOA unit and a (6+8k)th GOA unit, the second control clock end is connected to the third main clock signal, the third control clock end is connected to the fourth main clock signal, and the first control clock end is connected to the second main clock signal;

wherein in a (7+8k)th GOA unit and a (8+8k)th GOA unit, the second control clock end is connected to the fourth main clock signal, the third control clock end is connected to the first main clock signal, and the first control clock end is connected to the third main clock signal; wherein k is a positive integer.

13. The GOA circuit according to claim 8, wherein the GOA circuit receives a first minor clock signal, a second minor clock signal, a third minor clock signal, a fourth minor clock signal, a fifth minor clock signal, a sixth minor clock signal, a seventh minor clock signal, and an eighth minor clock signal, the first minor clock signal, the second minor clock signal, the third minor clock signal, the fourth minor clock signal, the fifth minor clock signal, the sixth minor clock signal, the seventh minor clock signal and the eighth minor clock signal is sequentially time-divided in an active period of the GOA circuit;

wherein in a (1+8k)th GOA unit, the second control clock end accesses the first minor clock signal, the third control clock end accesses the third minor clock signal, and the first control clock end accesses the seventh minor clock signal;

wherein in a (2+8k)th GOA unit, the second control clock end accesses the second minor clock signal, the third control clock end accesses the fourth minor clock signal, and the first control clock end accesses the eighth minor clock signal;

wherein in a (3+8k)th GOA unit, the second control clock end accesses the third minor clock signal, the third control clock end accesses the fifth minor clock signal, and the first control clock end accesses the first minor clock signal;

wherein in a (4+8k)th GOA unit, the second control clock end accesses the fourth minor clock signal, the third control clock end accesses the sixth minor clock signal, and the first control clock end accesses the second minor clock signal;

wherein in a (5+8k)th GOA unit, the second control clock end accesses the fifth minor clock signal, the third control clock end accesses the seventh minor clock signal, and the first control clock end accesses the third minor clock signal;

wherein in a (6+8k)th GOA unit, the second control clock end accesses the sixth minor clock signal, the third control clock end accesses the eighth minor clock signal, and the first control clock end accesses the fourth minor clock signal wherein in a (7+8k)th GOA unit, the second control clock end accesses the seventh minor clock signal, the third control clock end accesses the first minor clock signal, and the first control clock end accesses the fifth minor clock signal;

wherein in a (8+8k)th GOA unit, the second control clock end accesses the eighth minor clock signal, the third control clock end accesses the second minor clock signal, and the first control clock end accesses the sixth minor clock signal;

wherein k is a positive integer.

14. The GOA circuit according to claim 8, wherein the GOA unit further comprises a function control module, the function control module accesses a first function control signal and a second function control signal, and is electrically connected to the first node, the second node, and the current level scan driving signal, the function control module is used for implementing opening functions and shutdown functions of all of scanning drive signals for the GOA circuit.

15. The GOA circuit according to claim 14, wherein the function control module comprises: a thirteenth transistor, a fourteenth transistor, a fifteenth transistor, and a sixteenth transistor;

wherein a gate of the thirteenth transistor, a gate of the fourteenth transistor, and a source and a gate of the fifteenth transistor are connected to the first function control signal, a gate of the sixteenth transistor is connected to the second function control signal, a source of the thirteenth transistor, a source of the fourteenth transistor, and a source of the sixteenth transistor are connected to the constant low-level signal, a drain of the thirteenth transistor is electrically connected to the first node, a drain of the fourteenth transistor is electrically connected to the second node, a drain of the fifteenth transistor and a drain of the sixteenth transistor are electrically connected to a scan driving signal of the current stage.

16. The GOA circuit according to claim 15, wherein the GOA circuit comprises an open function phase and a shutdown function phase;

wherein in the opening function phase, the first function control signal is at a high level, and the second function control signal is at a low level;

wherein in the shutdown function phase, the first function control signal is at a low level, and the second function control signal is at a high level.

17. A display panel, comprising a gate driver on array (GOA) circuit, the GOA circuit comprises a multi-level cascaded GOA unit, each level of the GOA unit comprises a forward and reverse scanning module, an output module, and a pull-down module;

wherein the forward and reverse scanning module is connected to a first-level scan driving signal, a forward scanning signal, a next-stage scanning driving signal, a reverse scanning signal, and a constant low-level signal, and is electrically connected to a first control clock end, a third control clock end, a first node, and a second node, the forward and reverse scanning module is used for outputting the forward scanning signal to the first node, or for outputting the reverse scanning signal to the first node, and outputting the constant low-level signal to the second node a voltage potential control of the first node;

wherein the output module is connected to the constant low-level signal and a constant high-level signal, and is electrically connected to the first node and the second control clock end for outputting a scan driving signal of the current stage;

wherein the pull-down module is connected to the constant low-level signal, the forward scanning signal, the reverse scanning signal, and the constant high-level signal, and is electrically connected to the first control clock end, the third control clock end, the first node, and the scan driving signal of the current stage, the pull-down module is used for pulling down a voltage potential of the first node and a voltage potential of the scan driving signal of the current stage to the constant low-level signal.

18. The display panel according to claim 17, wherein the forward and reverse scanning module comprises a first transistor, a second transistor, a third transistor, a fourth transistor, and a fifth transistor;

wherein a gate of the first transistor is electrically connected to the first control clock end, a source of the first transistor is connected to the forward scanning signal, a drain of the first transistor is electrically connected to a source of the second transistor, a gate of the second transistor is connected to the upper scan driving signal, a drain of the second transistor is electrically connected to the first node, a gate of the third transistor is electrically connected to the third control clock end, a source of the third transistor is connected to the reverse scanning signal, a drain of the third transistor is electrically connected to a source of the fourth transistor, a gate of the fourth transistor is connected to a scanning driving signal of the next stage, a drain of the fourth transistor is electrically connected to the first node, a gate of the fifth transistor is electrically connected to the first node, a source of the fifth transistor is connected to the constant low-level signal, a drain of the fifth transistor is electrically connected to the second node.

19. The display panel according to claim 17, wherein the output module comprises a sixth transistor, a seventh transistor, and a first capacitor;

wherein a gate of the sixth transistor is connected to the constant high-level signal, a source of the sixth transistor is electrically connected to the first node, a drain of the sixth transistor is electrically connected to a gate of the seventh transistor, a source of the seventh transistor is electrically connected to the first control clock end, a drain of the seventh transistor is electrically connected to the scanning driving signal of the current stage, an end of the first capacitor is electrically connected to the first node, the other end of the first capacitor is electrically connected to the constant low-level signal.

20. The display panel according to claim 17, wherein the pull-down module comprises: an eighth transistor, a ninth transistor, a tenth transistor, an eleventh transistor, a twelfth transistor, and a second capacitor;

wherein a gate of the eighth transistor is connected to the forward scan signal, a source of the eighth transistor is electrically connected to the third control clock end, a gate of the ninth transistor is connected to the reverse scanning signal, a source of the ninth transistor is electrically connected to the first control clock end, a drain of the eighth transistor and a drain of the ninth transistor are electrically connected to a gate of the tenth transistor, a source of the tenth transistor is connected to the constant high-level signal, a drain of the tenth transistor, a gate of the eleventh transistor, and a gate of the twelfth transistor are electrically connected to the second node, a source of the eleventh transistor and a source of the twelfth transistor are connected to the constant low-level signal, a drain of the eleventh transistor is electrically connected to the first node, a drain of the twelfth transistor is electrically connected to the scan driving signal of the current stage, an end of the second capacitor is electrically connected to the second node, and the other end of the second capacitor is electrically connected to the constant low-level signal.

* * * * *